(12) United States Patent
Peng et al.

(10) Patent No.: US 7,699,094 B2
(45) Date of Patent: Apr. 20, 2010

(54) VAPOR CHAMBER HEAT SINK

(75) Inventors: Xue-Wen Peng, Shenzhen (CN); Bing Chen, Shenzhen (CN); Jun-Hai Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 1027 days.

(21) Appl. No.: 11/308,764

(22) Filed: Apr. 28, 2006

(65) Prior Publication Data

US 2007/0251670 A1 Nov. 1, 2007

(51) Int. Cl.
*H05K 7/20* (2006.01)
(52) U.S. Cl. .................. 165/80.3; 165/104.33; 361/700
(58) Field of Classification Search ................ 165/80.3, 165/104.33; 361/697, 700
See application file for complete search history.

(56) References Cited

U.S. PATENT DOCUMENTS

| | | | |
|---|---|---|---|
| 6,381,845 B2 | 5/2002 | Ikeda et al. | |
| 6,647,625 B2 | 11/2003 | Wang et al. | |
| 6,918,429 B2* | 7/2005 | Lin et al. | 165/80.3 |
| 6,964,295 B1* | 11/2005 | Yu et al. | 165/104.33 |
| 7,013,960 B2* | 3/2006 | Lee et al. | 165/104.33 |
| 7,021,368 B2* | 4/2006 | Lin et al. | 165/104.33 |
| 7,347,251 B2* | 3/2008 | Foster et al. | 165/104.33 |
| 7,357,174 B2* | 4/2008 | Hsu et al. | 165/104.33 |
| 2005/0183842 A1* | 8/2005 | Lin | 165/80.2 |
| 2005/0183849 A1* | 8/2005 | Ko et al. | 165/104.33 |
| 2005/0259405 A1* | 11/2005 | He | 361/729 |
| 2006/0207747 A1* | 9/2006 | Lin | 165/80.3 |
| 2007/0144709 A1* | 6/2007 | Lee et al. | 165/104.33 |
| 2007/0215327 A1* | 9/2007 | Lai et al. | 165/104.33 |

FOREIGN PATENT DOCUMENTS

| | | |
|---|---|---|
| CN | 1641868 A | 7/2005 |
| CN | 1670950 A | 9/2005 |
| CN | 2746441 Y | 12/2005 |
| CN | 2770090 Y | 4/2006 |

\* cited by examiner

*Primary Examiner*—Allen J Flanigan
(74) *Attorney, Agent, or Firm*—Frank R. Niranjan (57) ABSTRACT

A vapor chamber heat sink attached to a heat-generating electronic component includes a base (10) defining an opening therein. A plurality of fins (20) is mounted on the base. A heat pipe (30) thermally connects the electronic component and the fins. The heat pipe comprises a plate-type lower portion (32) contacting a bottom surface of the base and a bottom surface (22) of the fins and overlaying a top surface of the electronic component, a plate-type upper portion (34) parallel to the lower portion contacting a top surface (24) of the fins, and a connecting portion (36) interconnecting opposite two ends of the lower and upper portions. The heat pipe is configured in such a manner so as to enhance contact area and thermal conductivity between the heat pipe and the electronic component and between the heat pipe and the fins.

9 Claims, 9 Drawing Sheets

VAPOR CHAMBER HEAT SINK

FIELD OF THE INVENTION

The present invention relates to a heat sink, and particularly to a vapor chamber heat sink having a wide contact area.

DESCRIPTION OF RELATED ART

A computer central processing unit (CPU) is the core controller of electrical signals in most contemporary personal computers. Continued development of CPUs has enabled them to perform more and more functions. Heat generated by the CPUs has thus increased enormously. Such heat can adversely affect the operational stability of the computers. Measures must be taken to efficiently remove the heat from the CPU. Typically, a heat sink with heat pipes having great heat conductivity is mounted on the CPU to remove heat therefrom.

Figure 9:
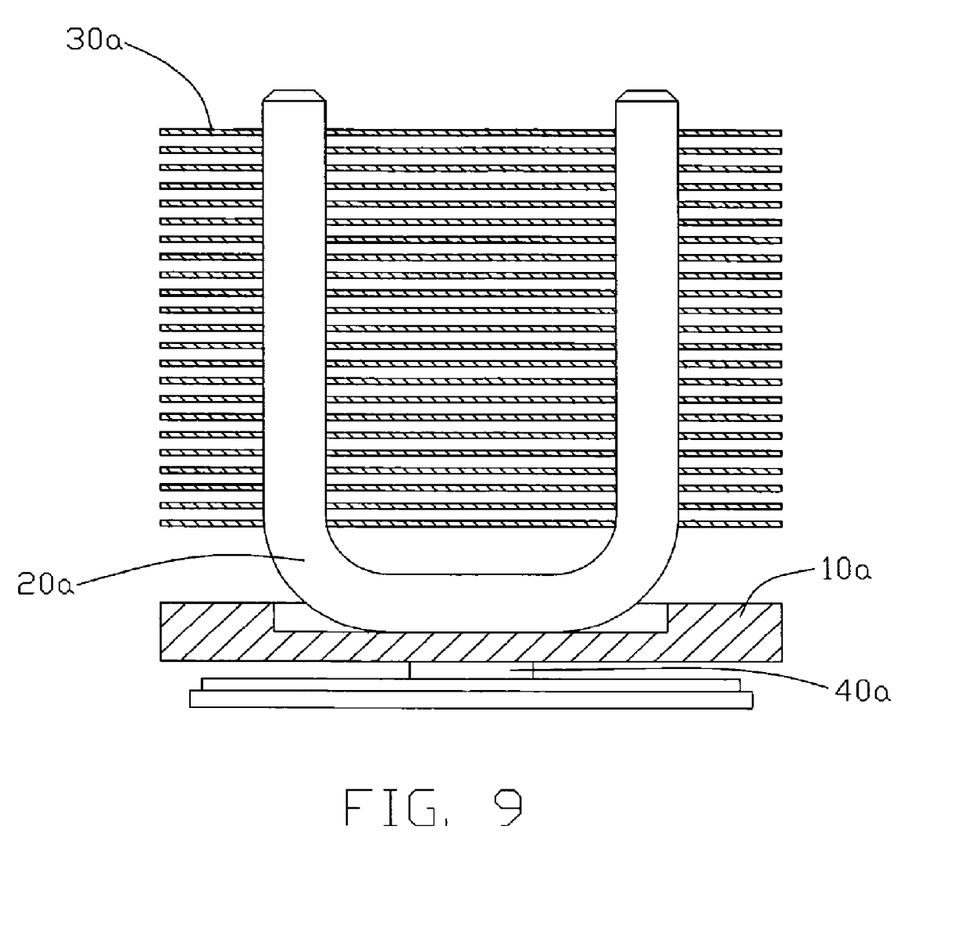
FIG. 9 is a cross-sectional view of a conventional heat sink mounted on a heat generating device.

Referring to FIG. 9, a conventional heat sink with a heat pipe includes a plate-type base 10a, a plurality of fins 30a mounted on the base 10a and a heat pipe 20a thermally connecting the base 10a and the fins 30a. The heat pipe 20a has a round cross section and includes an evaporating portion contacting with a top of the base 10a and a pair of condensing portions connecting with the evaporating portion and extending through the fins 30a. In use, the heat sink is mounted on a heat generating device 40a, and heat generated by the heat generating device 40a is transferred to the evaporating portions of the heat pipe 20a via the base 10a. The heat absorbed by the evaporating portions is subsequently transferred to the fins 30a via the condensing portions of the heat pipe 20a and is then dissipated to the atmosphere. However, due to a linear contact between the heat pipe 20a and the fins 30a contact area between the heat pipe 20a and the fins 30a is narrow and thermal conductive speed from the base 10a to a top of the fins 30a is excessively low.

What is needed is a heat sink with heat pipes having wide contact area to maximize heat-dissipating efficiency.

SUMMARY OF INVENTION

According to a preferred embodiment of the present invention, a vapor chamber heat sink attached to a heat-generating electronic component includes a base defining an opening therein. A plurality of fins is mounted on the base. A heat pipe thermally connects the electronic component and the fins. The heat pipe comprises a plate-type lower portion contacting a bottom surface of the base and a bottom surface of the fins. The lower portion of the heat pipe also overlays a top surface of the electronic component. A plate-type upper portion parallel to the lower portion contacts a top surface of the fins, and a connecting portion interconnecting two opposite ends of the lower and upper portions. The heat pipe is configured in such a manner so as to enhance contact area and thermal conductive speed between the heat pipe and the electronic component and between the heat pipe and the fins.

Other advantages and novel features of the present invention will become more apparent from the following detailed description of preferred embodiment when taken in conjunction with the accompanying drawings, in which:

BRIEF DESCRIPTION OF DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION

Figure 1:
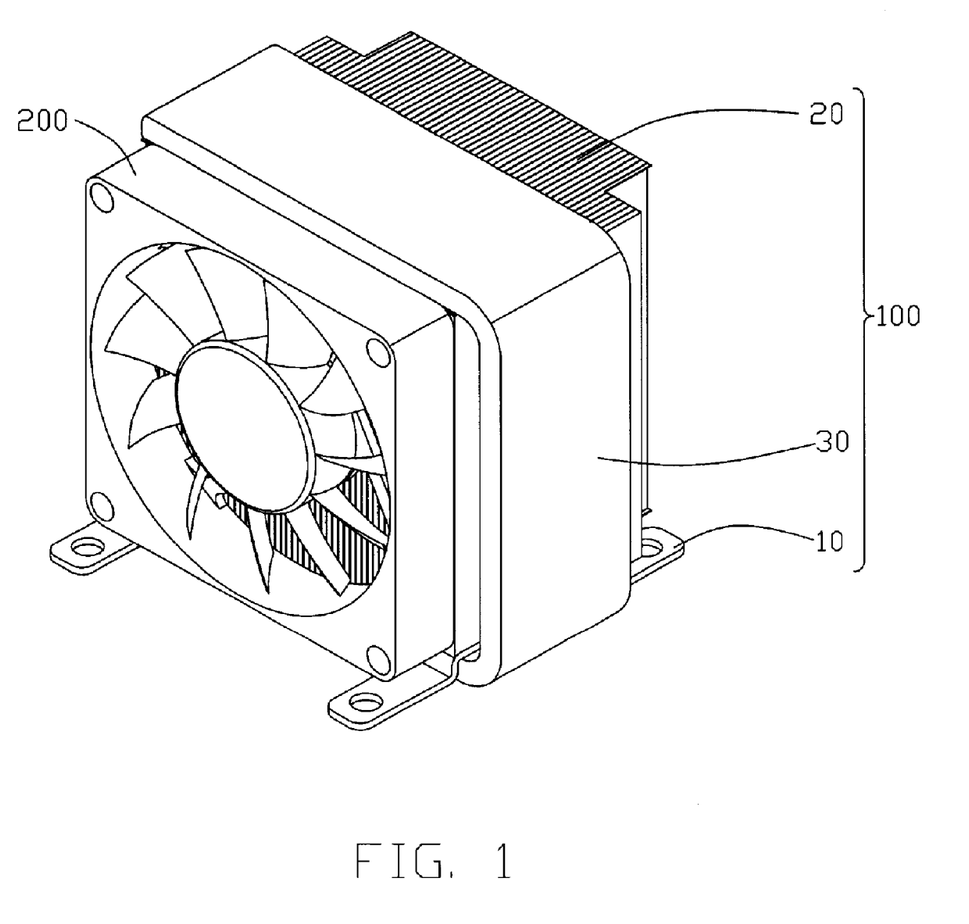
FIG. 1 is an assembled view of a vapor chamber heat sink and a fan according to a preferred embodiment of the present invention.

FIG. 1 shows a vapor chamber heat sink 100 in accordance with a preferred embodiment of the present invention. The heat sink 100 is configured for cooling a heat-generating electronic component (not shown), such as, for example, an integrated circuit or a CPU chip, which emits heat. The heat sink 100 dissipates heat from the heat-generating electronic component. The heat sink 100 comprises a base 10, a plurality of fins 20 mounted on the base 10 and a U-shaped, flat-type heat pipe 30 thermally connecting the heat-generating electronic component and the fins 20. A fan 200 is mounted on a front side of the fins 20 to generate and direct an airflow through channels formed between the fins 20. The channels extend along a front-to-rear direction.

Figure 2:
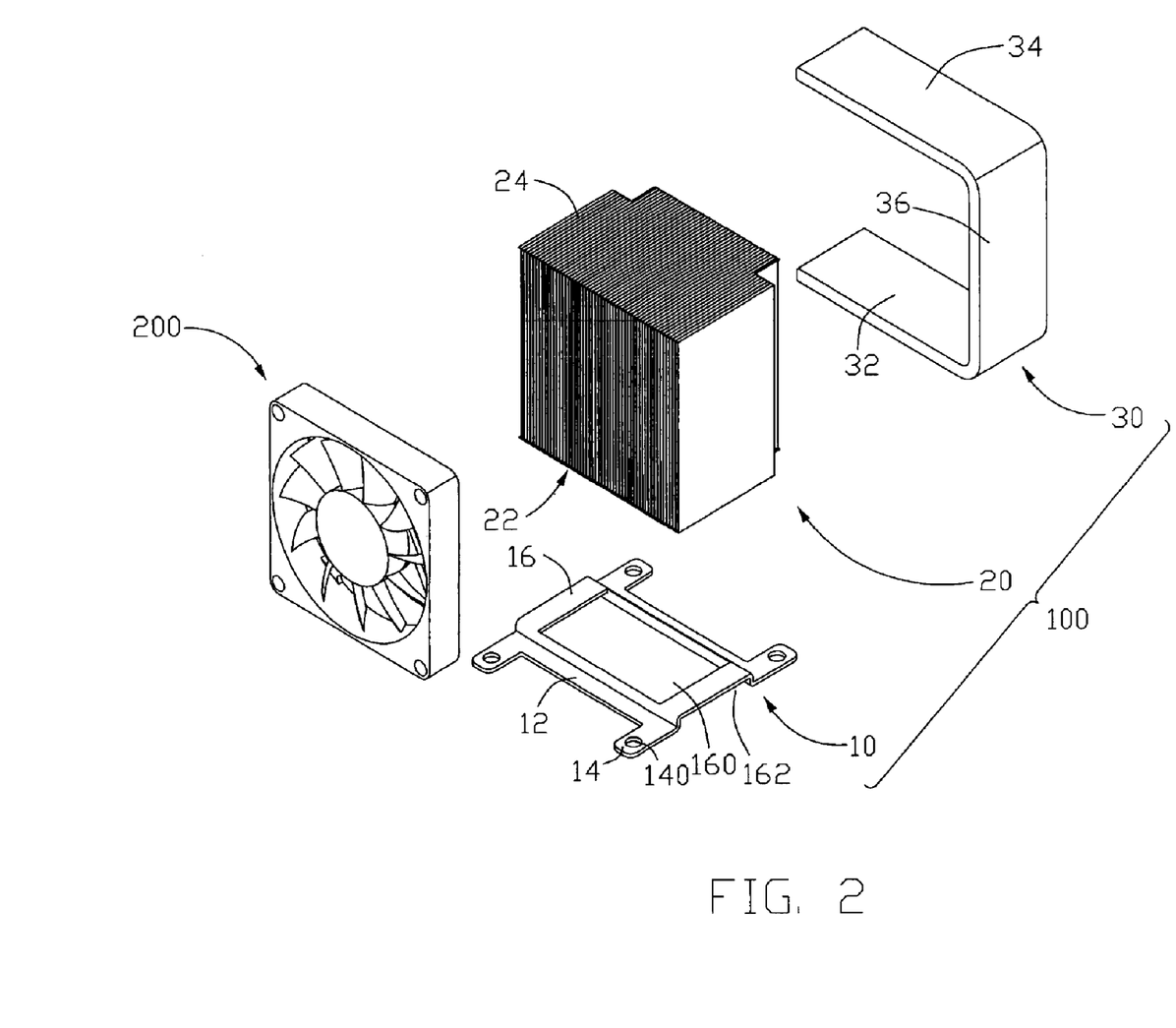
FIG. 2 is an exploded, isometric view of FIG. 1.

Referring to FIG. 2, the heat pipe 30 is made of high thermally conductive metal material such as copper or aluminum and define therein a U-shaped chamber in which a wick structure (not shown) and working fluid (not shown) are preferably provided. The wick structure for the heat pipe 30 may include fine grooves integrally formed in an inner wall of the heat pipe 30, mesh or bundles of fiber inserted into the heat pipe 30 and held against the inner wall thereof, sintered powders combined to the inner wall of the heat pipe 30 by a sintering process, or any appropriate combination thereof. The heat pipe 30 includes a plate-type lower portion 32 contacting a bottom surface 22 of the fins 20 and a top surface of the electronic component, a plate-type upper portion 34 contacting a top surface 24 of the fins 20 and a plate-type connecting portion 36 interconnecting the lower portion 32 and the upper portion 34. The lower, upper portions 32, 34 and the connecting portion 36 each have a flat vacuum chamber intercommunicating with each other. The lower, upper portions 32, 34 and the connecting portion 36 each have same width and thickness, wherein the width is greater than the thickness giving the heat pipe 30 a wide contact surface which can contact with most of the bottom and top surfaces 22, 24 of the fins 20.

The base 10 is used for mounting the heat sink 100 on a board (not shown) having the heat-generating electronic component thereon. The base 10 comprises four legs 14 each extending outwardly from a corner thereof. Each of the legs 14 defines a locating hole 140 for providing passage of a fastener (not shown). A rectangular protrusion 16 upwardly protrudes relative to the legs 14 at a center portion of the base 10 such that a space 162 is formed between the top surface of the heat-generating electronic component and a bottom surface of the protrusion 16 for facilitating insertion of the lower portion 32 of the heat pipe 30. A rectangular opening 160 is defined in the protrusion 16 such that a top surface of the lower portion 32 of the heat pipe 30 contacts the bottom surface 22 of the fins 20.

The fan 200 is mounted adjacent to the channels of the fins 20 so as to provide a forced airflow through the fins 20 for facilitating heat dissipation of the fins 20. This forced airflow further promotes the heat dissipation effectiveness of the heat dissipation device.

When the heat sink 100 is applied to the heat-generating electronic component, the bottom surface of lower portion 32 contacts and overlays the electronic component and draws heat therefrom. The heat quickly and evenly spreads on the lower portion 32 due to a wide contact area between the electronic component and the lower portion 32. Then, one part of the heat on the lower portion 32 is conducted to the upper portion 34 via the connecting portion 36 and then transmitted to the top surface of the fins 20 for dissipation to an outside environment directly through the fins 20. Another part of the heat on the lower portion 32 is directly transferred to the top surface 24 of the fins 20 for dissipation to an environment. Thus, the heat can be quickly transferred to fins 20 via the heat pipe 30, and the heat of the heat-generating electronic component is continuously transferred to the fins 20 via the heat pipe 30 and dissipated by the fins 20 to ambient air. The heat dissipation efficiency of the heat sink 100 is thus greatly improved.

Figure 3:
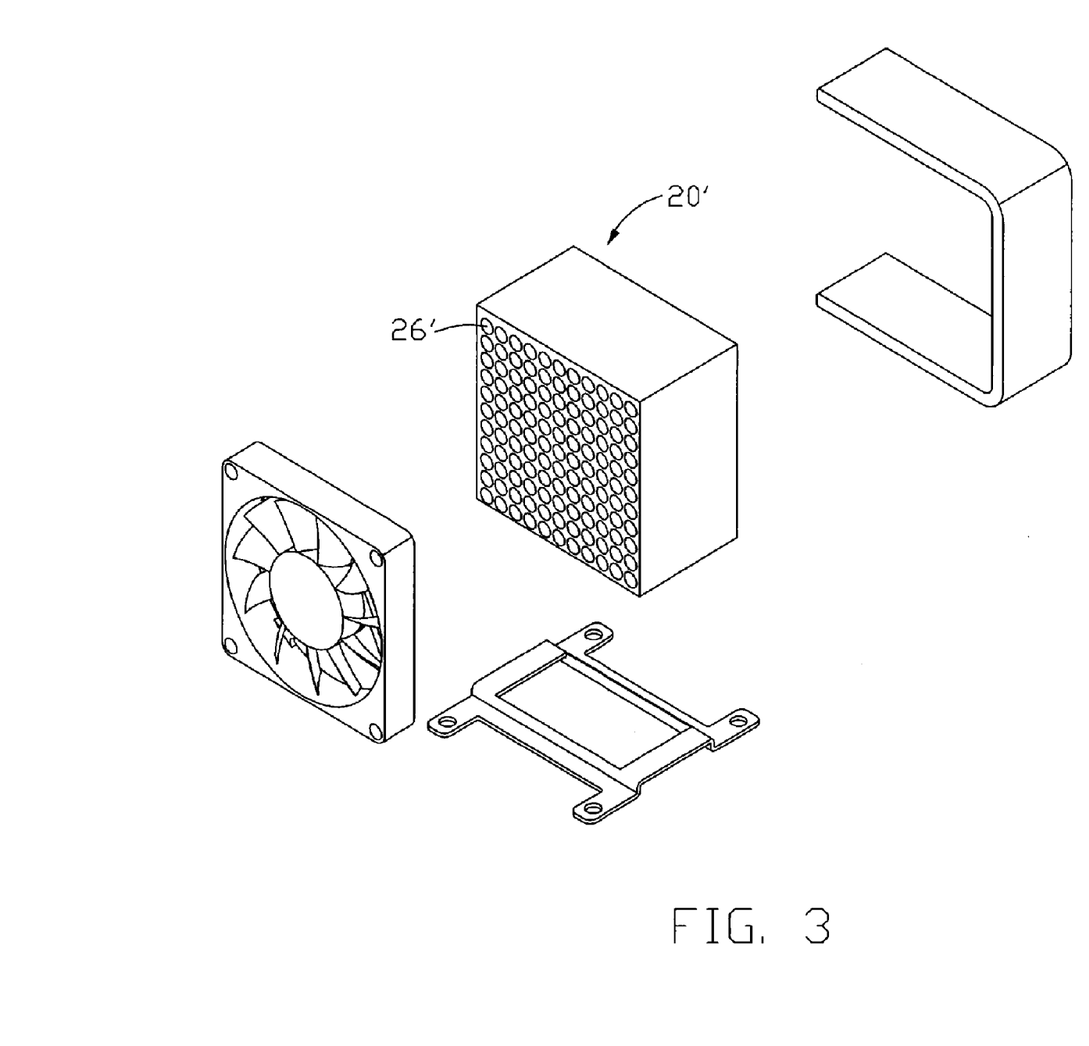
FIG. 3 is an exploded view of a vapor chamber heat sink and a fan according to a second embodiment of the present invention.

FIG. 3 shows a heat sink with a fan in accordance with a second embodiment of the present invention. The heat sink of the second embodiment is similar to that of the preferred embodiment. However, a radiator 20' replaces the fins 20 of the previous preferred embodiment. The radiator 20' is capable of significantly enhancing the heat sink performance compared to the fins 20 and implementing simple construction and easier fabrication. The radiator 20' is made of foam/honeycombed metal such as copper, aluminum or any appropriate alloy of the two. The radiator 20' has a cubic configuration and defines a plurality of pores 26' therein.

Figure 4:
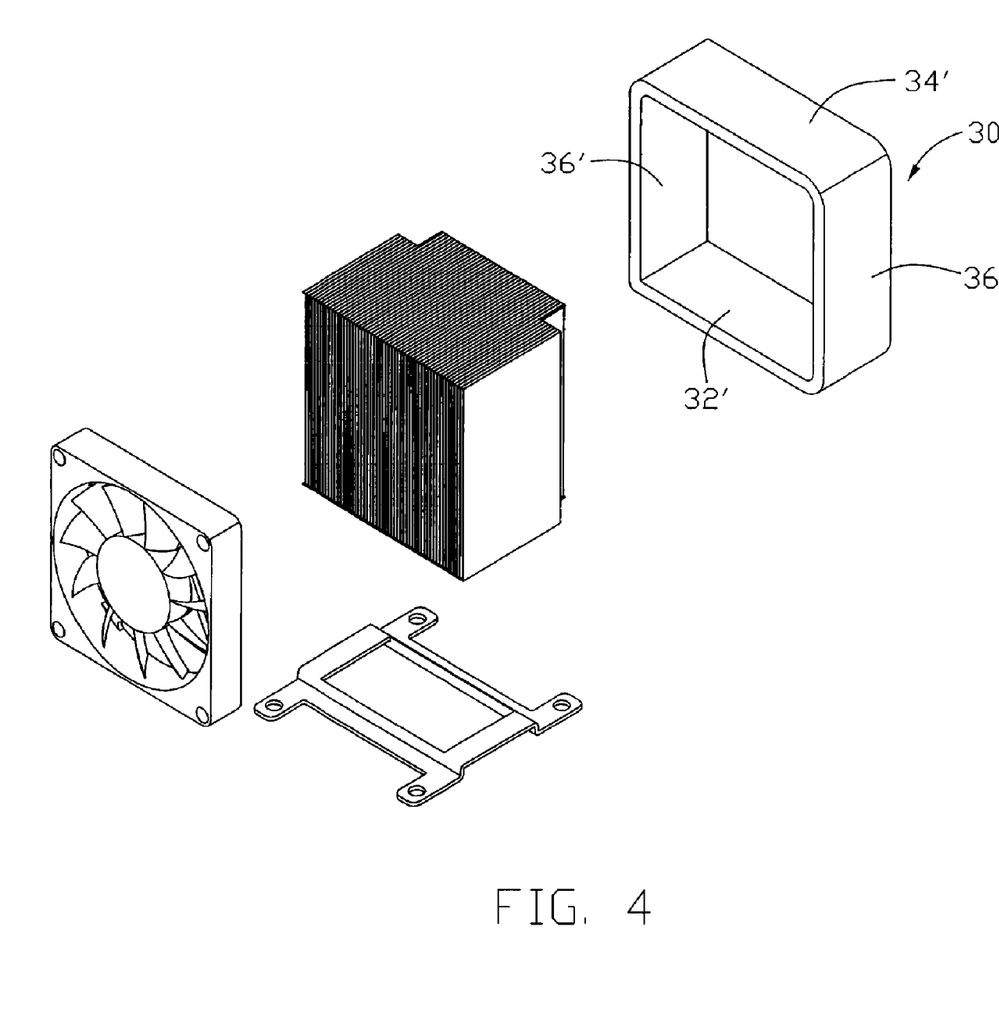
FIG. 4 is an exploded view of a vapor chamber heat sink and a fan according to a third embodiment of the present invention.

FIG. 4 shows a heat sink with a fan in accordance with a third embodiment of the present invention. In this third embodiment, a heat pipe 30' replaces the heat pipe 30 of the aforementioned first embodiment. The heat pipe 30' comprises a plate-type lower portion 32', a plate-type upper portion 34' parallel to the lower portion 32' and a pair of parallel plate-type connecting portions 36' interconnecting opposite two ends of the lower and upper portions 32', 34' such that a hermetically sealed liquid circulation loop is formed in the heat pipe 30' and the working fluid flows therein. The lower, upper portions 32', 34' and the connecting portions 36' each have a flat vacuum chamber intercommunicating with each other. The lower, upper portions 32', 34' and the connecting portion 36' each have a same width and thickness, wherein the width is much greater than the thickness giving the heat pipe 30' a wide contact surface. In this embodiment, heat absorbed by the lower portion 32' is conducted to the upper portion 34' via the two connecting portions 36' such that the heat of the lower portion 32' is conducted along twin circulation paths to accelerate conduction of the heat and enhance the heat dissipating efficiency of the heat sink.

Figure 5:
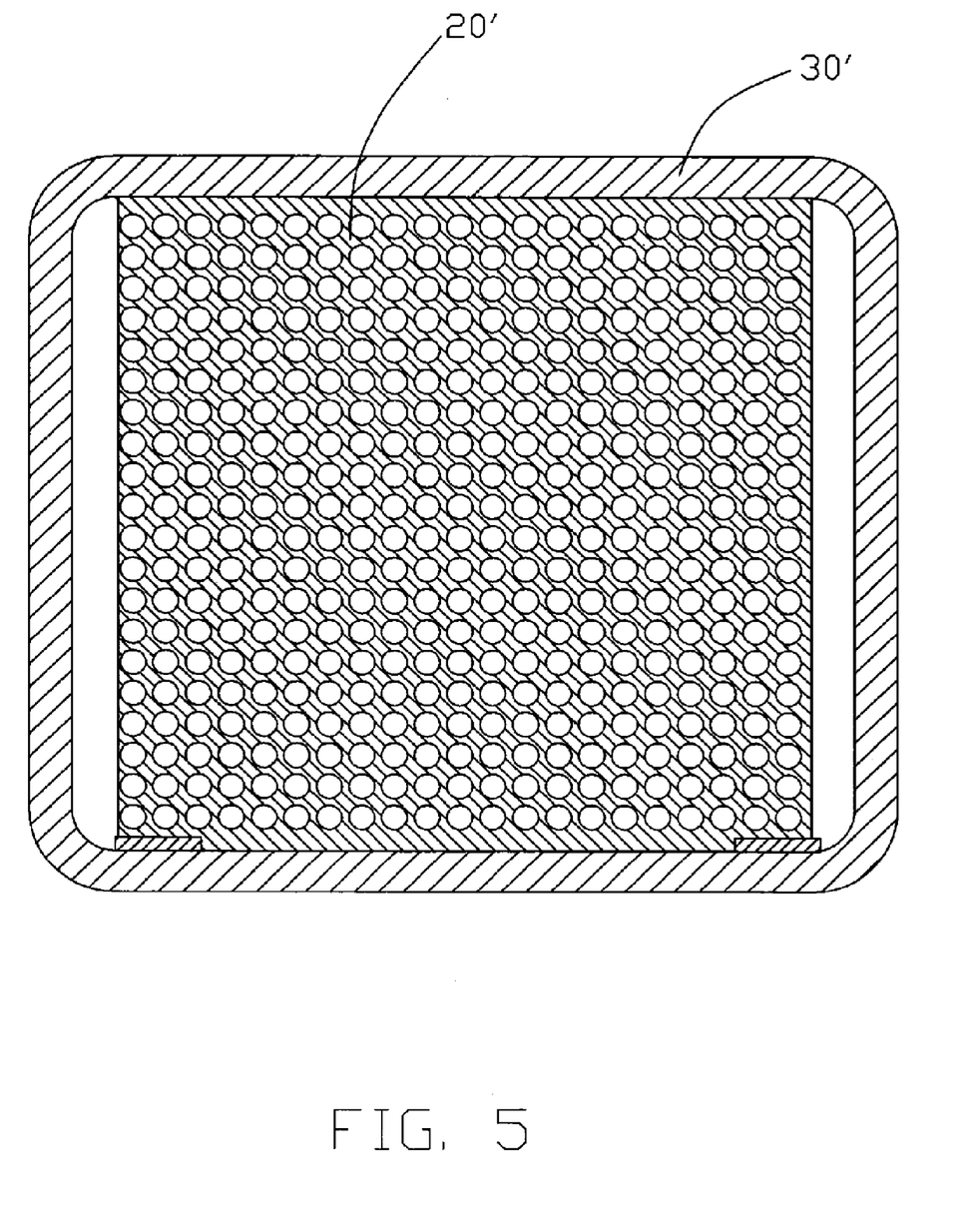
FIG. 5 is a front cross-sectional view of a vapor chamber heat sink according to a fourth embodiment of the present invention, wherein a fan is omitted.

FIG. 5 shows a heat sink according to a fourth embodiment of the present invention, wherein the difference between the fourth and the first embodiment is in that the heat pipe 30 of the first embodiment is replaced by the heat pipe 30' and the fins 20 are replaced by the radiator 20'.

Figure 6:
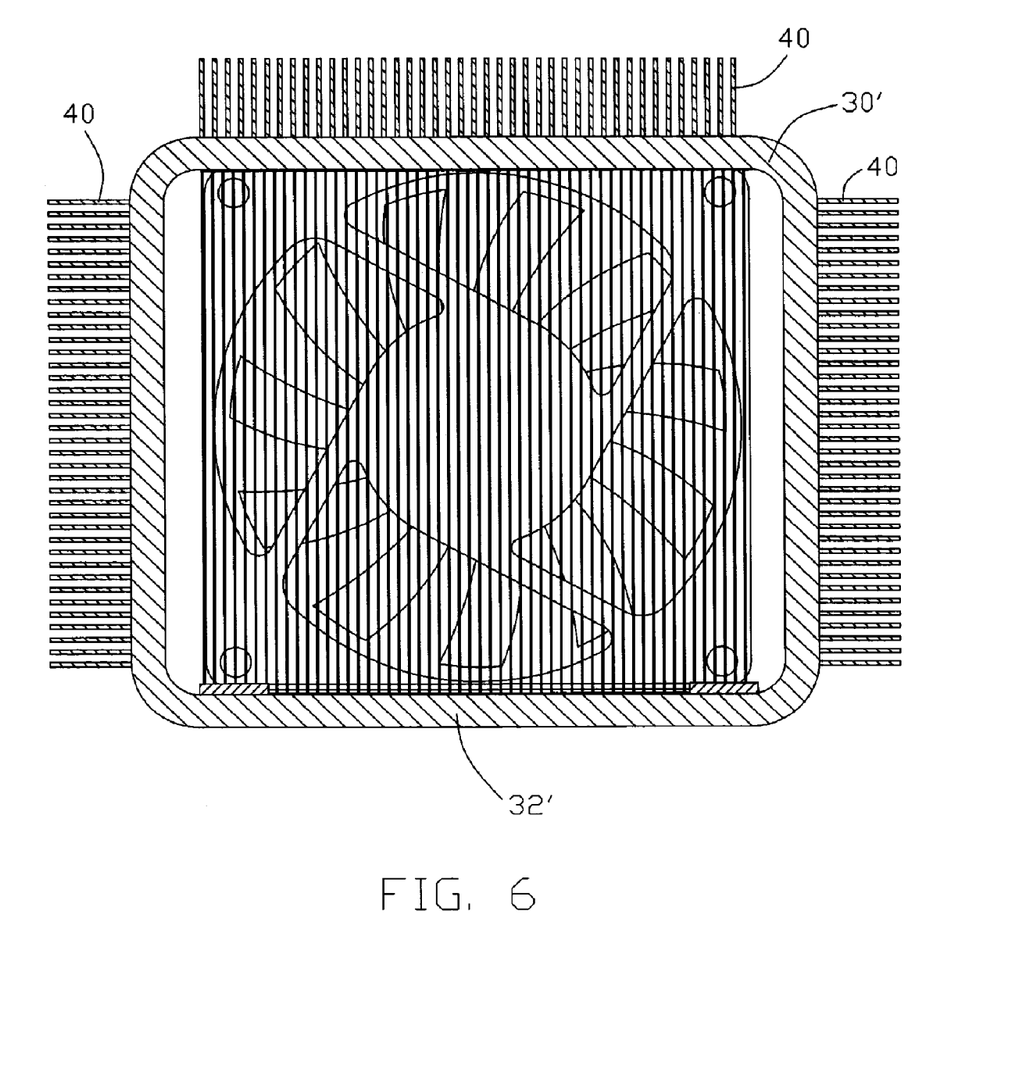
FIG. 6 is a front cross-sectional view of a vapor chamber heat sink and a fan according to a fifth embodiment of the present invention.
Figure 7:
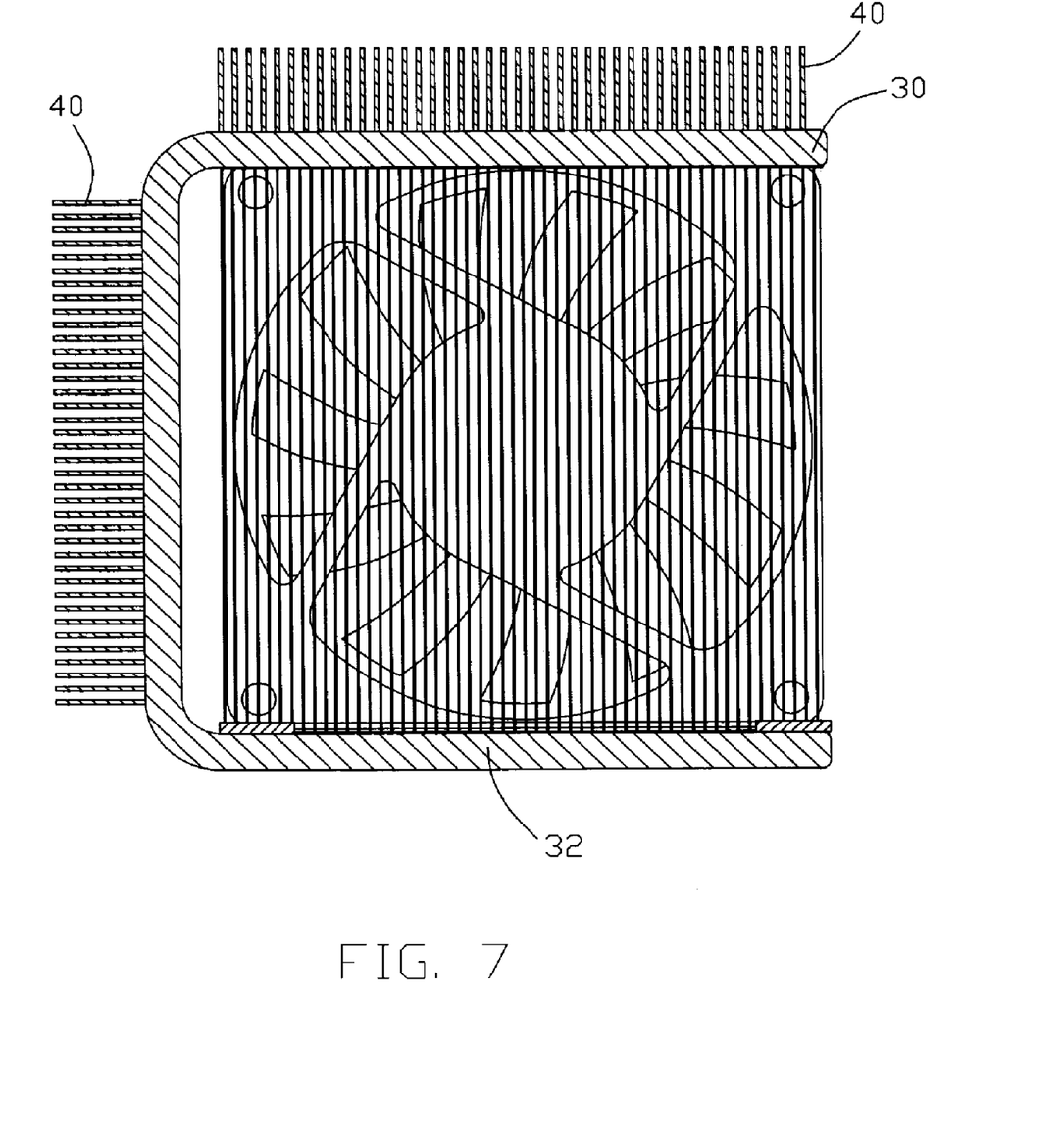
FIG. 7 is a front cross-sectional view of a vapor chamber heat sink and a fan according to a sixth embodiment of the present invention.
Figure 8:
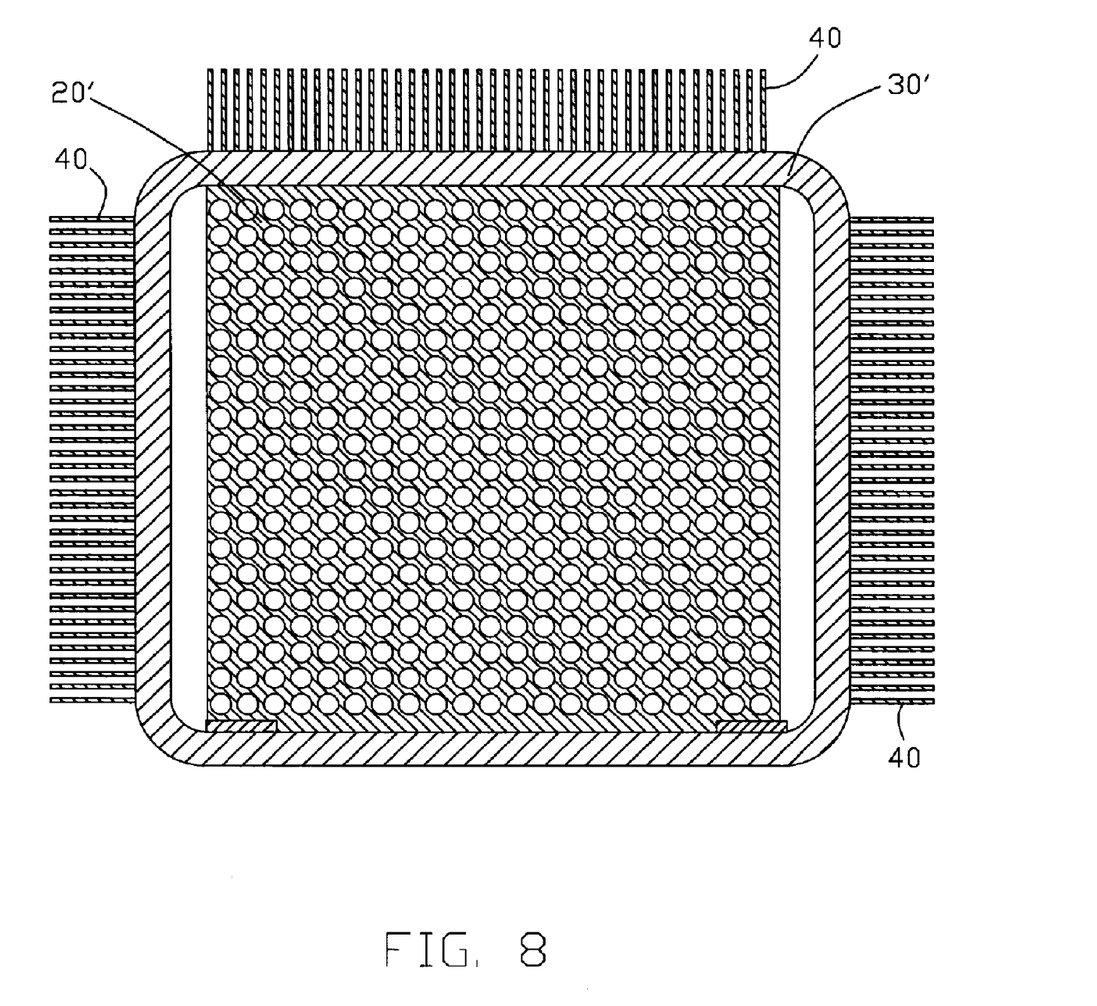
FIG. 8 is a front cross-sectional view of a vapor chamber heat sink according to a seventh embodiment of the present invention, wherein a fan is omitted.

FIGS. 6-8 respectively show heat sinks with fans in accordance with fifth, sixth and seventh embodiments of the present invention. In the fifth embodiment, a plurality of second fins 40 is formed on the outer surface of the heat pipe 30' of the third embodiment, except for the lower portion 32' of the heat pipe 30'. The second fins 40 are used to enhance the heat dissipating efficiency of the heat sink. In the sixth embodiment, a plurality of second fins 40 is formed on the outer surface of the heat pipe 30 of the first embodiment, except for the lower portion 32 of the heat pipe 30. In the seventh embodiment, a plurality of second fins 40 is formed on the outer surface of the heat pipe 30' of the fourth embodiment, except for the lower portion of the heat pipe 30'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A vapor chamber heat sink attached to a heat-generating electronic component, comprising:
    a base defining an opening therein;
    a plurality of first fins mounted on the base; and
    a heat pipe thermally connecting the electronic component and the first fins, the heat pipe comprising a plate-type lower portion contacting a bottom surface of the base and a bottom surface of the first fins and overlaying a top surface of the electronic component, a plate-type upper portion parallel to the lower portion contacting a top surface of the first fins, and a connecting portion interconnecting opposite two ends of the lower and upper portions.

2. The vapor chamber heat sink as described in claim 1, wherein the heat pipe defines a U-shaped chamber.

3. The vapor chamber heat sink as described in claim 1, wherein the heat pipe further comprises another connecting portion parallel to the connecting portion and interconnecting another opposite two ends of the lower and upper portions to form a chamber for circulation of working fluid in the heat pipe.

4. The vapor chamber heat sink as described in claim 3, wherein the upper portion and the connecting portions of the heat pipe form a plurality of second fins thereon.

5. The vapor chamber heat sink as described in claim 1, wherein the upper portion and the connecting portion of the heat pipe form a plurality of second fins thereon.

6. The vapor chamber heat sink as described in claim 1, wherein the base comprises four legs extending outwardly from four corners thereof.

7. The vapor chamber heat sink as described in claim 6, wherein a protrusion upwardly protrudes relative to the legs at a center portion of the base such that a space is formed between the top surface of the heat-generating electronic component and a bottom surface of the protrusion for facilitating insertion of the lower portion of the heat pipe.

8. The vapor chamber heat sink as described in claim 1, wherein the lower and upper portions and the connecting portion each have a same width and a same thickness, and the width is greater than the thickness such that the heat pipe has a wide contact surface and contacts with most of the bottom and top surfaces of the first fins.

9. The vapor chamber heat sink as described in claim 1, wherein a fan is mounted adjacent to channels formed between the first fins.

* * * * *